United States Patent
Lee et al.

(10) Patent No.: US 9,667,252 B1
(45) Date of Patent: May 30, 2017

(54) DUTY CYCLE CORRECTION CIRCUIT AND DUTY CYCLE CORRECTION METHOD

(71) Applicant: SK hynix Inc., Gyeonggi-do (KR)

(72) Inventors: Hyun-Bae Lee, Gyeonggi-do (KR); Yo-Han Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/147,291

(22) Filed: May 5, 2016

(30) Foreign Application Priority Data

Dec. 16, 2015 (KR) ........................ 10-2015-0179945

(51) Int. Cl.
*H03K 19/003* (2006.01)
*H03K 5/156* (2006.01)
*H03G 1/00* (2006.01)

(52) U.S. Cl.
CPC ..... *H03K 19/00346* (2013.01); *H03G 1/0005* (2013.01); *H03K 5/1565* (2013.01)

(58) Field of Classification Search
CPC .......... H03K 19/00346; H03K 5/1565; H03G 1/0005
USPC .................................. 327/156, 158, 172, 175
See application file for complete search history.

(56) References Cited

U.S. PATENT DOCUMENTS

2003/0117194 A1* 6/2003 Lee ........................ H03K 5/151
327/158

FOREIGN PATENT DOCUMENTS

KR 1020030052650 6/2003
KR 1020150068718 6/2015

* cited by examiner

*Primary Examiner* — John Poos
(74) *Attorney, Agent, or Firm* — IP & T Group LLP

(57) ABSTRACT

A duty cycle correction circuit may include: a phase mixing section capable of mixing a first integrated signal generated by integrating a positive clock signal, with a first compensation signal generated by differentiating and integrating the positive clock signal and a negative clock signal, respectively, to generate a first phase-mixed signal, and mixing a second integrated signal generated by integrating the negative clock signal, with a second compensation signal generated by integrating and differentiating the positive clock signal and the negative clock signal, respectively, to generate a second phase-mixed signal; and a noise removal section capable of receiving and removing a common mode noise between the first phase-mixed signal and the second phase-mixed signal by adjusting a cross-point therebetween, and outputting first and second duty-corrected clock signals.

24 Claims, 5 Drawing Sheets

DUTY CYCLE CORRECTION CIRCUIT AND DUTY CYCLE CORRECTION METHOD

CROSS-REFERENCE TO RELATED APPLICATIONS

The present application claims priority of Korean Patent Application No. 10-2015-0179945, filed on Dec. 16, 2015, which is incorporated herein by reference in its entirety.

BACKGROUND

1. Field

Exemplary embodiments of the present invention relate generally to a semiconductor design technology and, more particularly, to a duty cycle correction (DCC) circuit and a duty cycle correction method.

2. Description of the Related Art

In integrated circuit chips, such as for example, a CPU, a memory device, and the like, which operate based on a clock, it is very important to accurately control a clock duty cycle. For example, in a memory where data is inputted/outputted at a rising edge and a falling edge of a clock. When the clock duty cycle is not precisely 50%, the timing between the rising edge and the falling edge may be distorted, and thus data may be inputted/outputted at incorrect times. For reference, a clock duty cycle of 50% means that a high level period is substantially equal to a low level period.

Therefore, in various integrated circuit chips operating on a clock, a duty cycle correction circuit is typically employed for correcting the clock duty cycle. FIG. 1A is a block diagram illustrating a conventional duty cycle correction circuit. FIG. 1B is a waveform diagram illustrating an operation of the conventional duty cycle correction circuit of FIG. 1A.

Referring to FIG. 1A, the duty cycle correction circuit includes a receiver 110, a driver 120, a duty cycle detector 130, and a duty cycle corrector 140.

The receiver 110 receives clocks CLK and CLKB inputted to the duty cycle correction circuit. The driver 120 drives output clocks CLK_OUT and CLKB_OUT in response to input clocks CLK_IN and CLK_INB outputted from the receiver 110. The duty cycle detector 130 detects duty cycles of the output clocks CLK_OUT and CLKB_OUT. Here, detecting the duty cycles means identifying whether high level periods ("Ta" in FIG. 1B) or low level periods ("Tb" in FIG. 1B) of the output clocks CLK_OUT and CLKB_OUT are longer than the other one. The duty cycle corrector 140 corrects duty cycles of the input clocks CLK_IN and CLK_INB depending on duty correction values DCC_OUT and DCC_OUTB outputted from the duty cycle detector 130.

Referring to FIG. 1B, when the duty cycle detector 130 determines that the high level periods Ta of the output clocks CLK_OUT and CLKB_OUT are relatively longer than the low level periods Tb, the duty cycle corrector 140 increases the low level periods of the input clocks CLK_IN and CLK_INB. In an opposite case, the duty cycle corrector 140 increases the high level periods of the input clocks CLK_IN and CLK_INB. Since the driver 120 employs a clock received by the receiver 110 and a duty correction value from the duty cycle corrector 140 as the input thereof, the duty corrected output clocks CLK_OUT and CLKB_OUT are outputted from the driver 120.

As described above, such a feedback-type duty cycle correction circuit increases or decreases the high level periods of the input clocks CLK_IN and CLK_INB at small increments or decrements using a feedback duty cycle detection result, and is locked when the degree of distortion of the duty cycle is reduced below a predetermined margin. That is to say, the duty cycle correction circuit operates similarly to a delay-locked loop (DLL), and requires a separate locking time until the duty cycle is corrected, like the delay-locked loop.

When a locking time is required before the duty cycle is corrected, a device repeatedly transitioned from or to a standby mode such as an idle mode to or from an operation mode such as an active mode, must wait for the locking time to correct the duty cycle on a wake-up time at which a transition is made from the idle mode to the active mode.

SUMMARY

Various embodiments are directed to a duty cycle correction circuit capable of correcting a duty with a minimized locking time.

In addition, various embodiments are directed to provide a duty cycle correction circuit capable of correcting a duty through an inverter, a digital logic gate, or the like, instead of analog amplifiers.

In an embodiment, a duty cycle correction circuit may include: a phase mixing section capable of mixing a first integrated signal generated by integrating a positive clock signal, with a first compensation signal generated by differentiating and integrating the positive clock signal and a negative clock signal, respectively, to generate a first phase-mixed signal, and mixing a second integrated signal generated by integrating the negative clock signal, with a second compensation signal generated by integrating and differentiating the positive clock signal and the negative clock signal, respectively, to generate a second phase-mixed signal; and a noise removal section capable of receiving and removing a common mode noise between the first phase-mixed signal and the second phase-mixed signal by adjusting a cross-point therebetween, and outputting first and second duty-corrected clock signals.

In an embodiment, a duty cycle correction circuit may include: a first inverter capable of receiving a positive clock signal and driving a first node; a first capacitor coupled between the first node and a ground voltage terminal; a second inverter capable of receiving a negative clock signal and driving a second node; a second capacitor coupled between the second node and the ground voltage terminal; a third inverter capable of receiving the negative clock signal and driving a third node; a fourth inverter capable of receiving the positive clock signal and driving a fourth node; a third capacitor coupled between the third node and the fourth node; a fifth inverter capable of receiving a first integrated signal outputted through the first node, and driving a compatible node; a sixth inverter capable of receiving a second integrated signal outputted through the second node, and driving an incompatible node; a seventh inverter capable of receiving a first compensation signal outputted through the third node, and driving the compatible node; and an eighth inverter capable of receiving a second compensation signal outputted through the fourth node, and driving the incompatible node.

In an embodiment, a duty cycle correction method may include: mixing a first integrated signal generated by integrating a positive clock signal, with a first compensation signal generated by differentiating and integrating the positive clock signal and a negative clock signal, respectively, to generate a first phase-mixed signal; mixing a second integrated signal generated by integrating the negative clock signal, with a second compensation signal generated by integrating and differentiating the positive clock signal and the negative clock signal, respectively, to generate a second phase-mixed signal; and removing a common mode noise by adjusting a cross point between the first phase-mixed signal and the second phase-mixed signal.

DETAILED DESCRIPTION

Figure 1A:
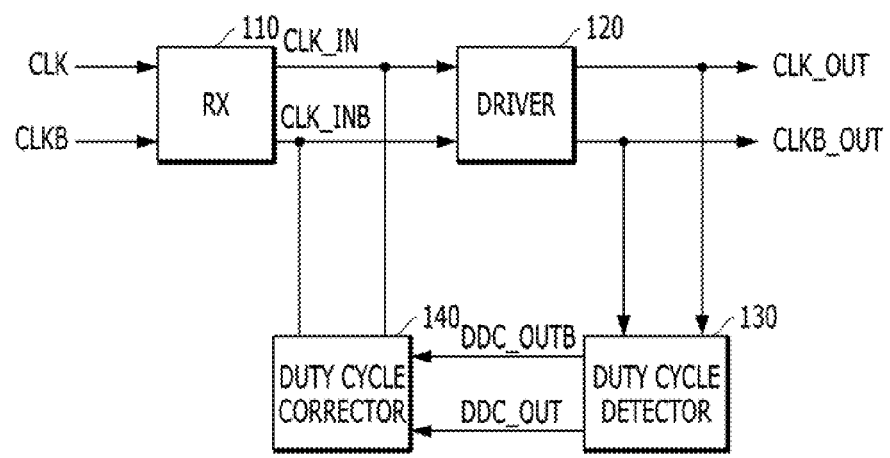
FIG. 1A is a block diagram illustrating a conventional duty cycle correction circuit.
Figure 1B:
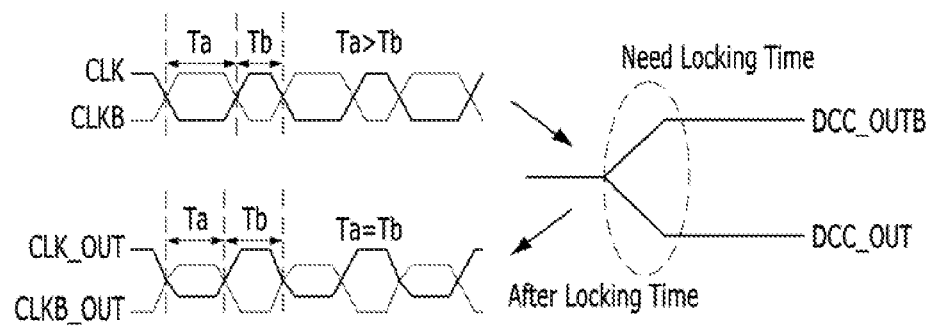
FIG. 1B is a waveform diagram illustrating an operation of the conventional duty cycle correction of FIG. 1A.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the relevant art. Throughout the disclosure, like reference numerals refer to like parts throughout the various figures and embodiments of the present invention. It is also noted that in this specification, "connected/coupled" refers to one element not only directly coupling another element but also indirectly coupling another element through an intermediate element. It will be understood that, although the terms "first", "second", "third", and so on may be used herein to describe various elements, these elements are not be limited by these terms. These terms are used to distinguish one element from another element. Thus, a first element described below could be termed a second element without departing from the spirit and/or scope of the present disclosure. In addition, it will also be understood that when an element is referred to as being "between" two elements, it can be the only element between the two elements, or one or more intervening elements may also be present.

It will be further understood that the terms "comprises", "comprising", "includes", and "including" when used in this specification, specify the presence of the stated elements but do not preclude the presence or addition of one or more other elements.

The terminology used herein is for the purpose of describing particular embodiments only and is not intended to be limiting of the present disclosure. Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

Figure 2:
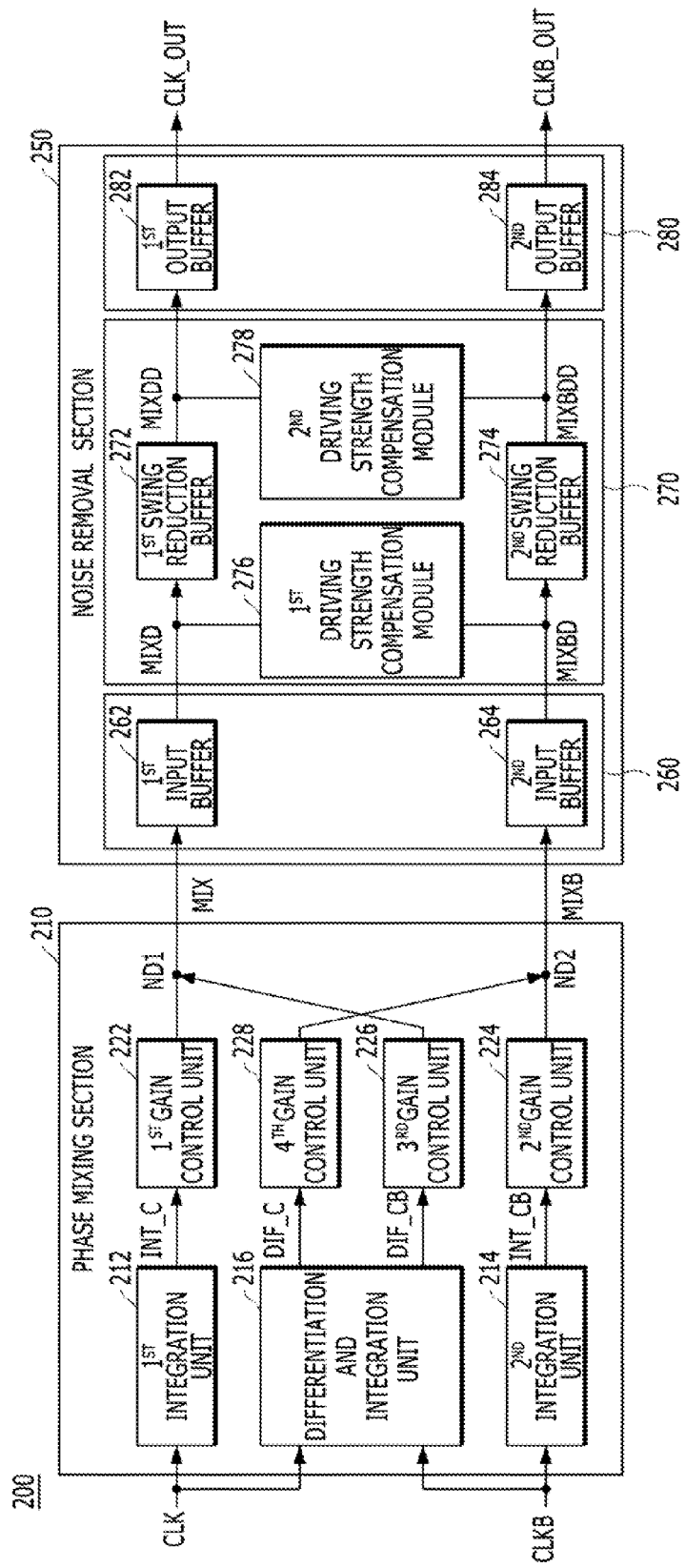
FIG. 2 is a block diagram illustrating a duty cycle correction circuit, according to an embodiment of the present invention.

Referring now to FIG. 2 a duty cycle correction circuit 200 is provided, according to an embodiment of the present invention.

Referring to FIG. 2, the duty cycle correction circuit 200 may include a phase mixing section 210 and a noise removal section 250.

The phase mixing section 210 may mix a first integrated signal INT_C generated by integrating a positive clock signal CLK, with a first compensation signal DIF_CB generated by differentiating and integrating a positive clock signal CLK and a negative clock signal CLKB, respectively, to generate a first phase-mixed signal MIX. The phase mixing section 210 may also mix a second integrated signal INT_CB generated by integrating the negative clock signal CLKB, with a second compensation signal DIF_C generated by integrating and differentiating the positive clock signal CLK and the negative clock signal CLKB, respectively, to generate a second phase-mixed signal MIXB. The noise removal section 250 may receive and remove a common mode noise between the first phase-mixed signal MIX and the second phase-mixed signal MIXB, and output a first duty-corrected clock signal CLK_OUT and a second duty-corrected clock signal CLKB_OUT.

More specifically, the phase mixing section 210 may include a first integration unit 212, a second integration unit 214, a differentiation and integration unit 216, and first to fourth gain control units 222-228.

The first integration unit 212 may integrate the positive clock signal CLK and generate the first integrated signal INT_C. The second integration unit 214 may integrate the negative clock signal CLKB and generate the second integrated signal INT_CB. The differentiation and integration unit 216 may generate the first compensation signal DIF_CB by differentiating and integrating the positive clock signal CLK and the negative clock signal CLKB, respectively; and may generate the second compensation signal DIF_C by differentiating and integrating the negative clock signal CLKB and the positive clock signal CLK, respectively. The first gain control unit 222 may amplify the first integrated signal INT_C by a first gain $\alpha$, and output the amplified signal to a compatible node ND1. The second gain control unit 224 may amplify the second integrated signal INT_CB by the first gain $\alpha$, and output the amplified signal to a incompatible node ND2. The third gain control unit 226 may amplify the first compensation signal DIF_CB by a second gain $\beta$, and output the amplified signal to the compatible node ND1. The fourth gain control unit 228 may amplify the second compensation signal DIF_C by the second gain $\beta$, and output the amplified signal to the incompatible node ND2.

Consequently, on the compatible node ND1, the first integrated signal INT_C amplified by the first gain $\alpha$ and the first compensation signal DIF_CB amplified by the second gain 1 are mixed and outputted as the first phase-mixed signal MIX. In addition, on the incompatible node ND2, the second integrated signal INT_CB amplified by the first gain α and the second compensation signal DIF_C amplified by the second gain β are mixed and outputted as the second phase-mixed signal MIXB. In this case, since the first gain α is greater than the second gain β, the first phase-mixed signal MIX may be generated so that the positive clock signal CLK has a dominant effect on the compatible node ND1 in comparison with the negative clock signal CLKB, and the second phase-mixed signal MIXB may be generated so that the negative clock signal CLKB has a dominant effect on the incompatible node ND2 in comparison with the positive clock signal CLK. The first gain α and the second gain β may be set to have optimum values according to process, voltage, and temperature (PVT) variations through a calibrating operation.

The noise removal section 250 may include an input buffer unit 260, a common mode compensation unit 270, and an output buffer unit 280.

The input buffer unit 260 may include a first input buffer 262 for buffering the first phase-mixed signal MIX and outputting a first swing input signal MIXD. The input buffer unit 260 may also include a second input buffer 264 for buffering the second phase-mixed signal MIXB and outputting a second swing input signal MIXBD.

The common mode compensation unit 270 may receive the first swing input signal MIXD and the second swing input signal MIXBD, and output a first swing output signal MIXDD and a second swing output signal MIXBDD, wherein a cross point between the first swing input signal MIXD and the second swing input signal MIXBD and a cross point between the first swing output signal MIXDD and the second swing output signal MIXBDD are adjusted to remove the common mode noise. The common mode compensation unit 270 may include first and second swing reduction buffers 272 and 274, and first and second driving strength compensation modules 276 and 278. The first swing reduction buffer 272 may buffer the first swing input signal MIXD and output the first swing output signal MIXDD. The second swing reduction buffer 274 may buffer the second swing input signal MIXBD and output the second swing output signal MIXBDD. The first driving strength compensation module 276 may be coupled between a terminal for the first swing input signal MIXD and a terminal for the second swing input signal MIXBD. The second driving strength compensation module 278 may be coupled between a terminal for the first swing output signal MIXDD and a terminal for the second swing output signal MIXBDD.

The output buffer unit 280 may include a first output buffer 282 for buffering the first swing output signal MIXDD and outputting the first duty-corrected clock signal CLK_OUT, and a second output buffer 284 for buffering the second swing output signal MIXBDD and outputting the second duty-corrected clock signal CLKB_OUT.

As described above, according to an embodiment of the present invention, the duty cycle correction circuit 200 mixes phase information of the positive clock signal CLK and the negative clock signal CLKB in a feed-forward manner through the phase mixing section 210, instead of using a conventional feed-back loop; and then compensates a mismatching of a common mode caused by the phase mixing, through the noise removal section 250, so that the duty cycle can be corrected.

Hereinafter, a detailed duty cycle correction circuit in accordance with an embodiment of the present invention will be described.

Figure 3:
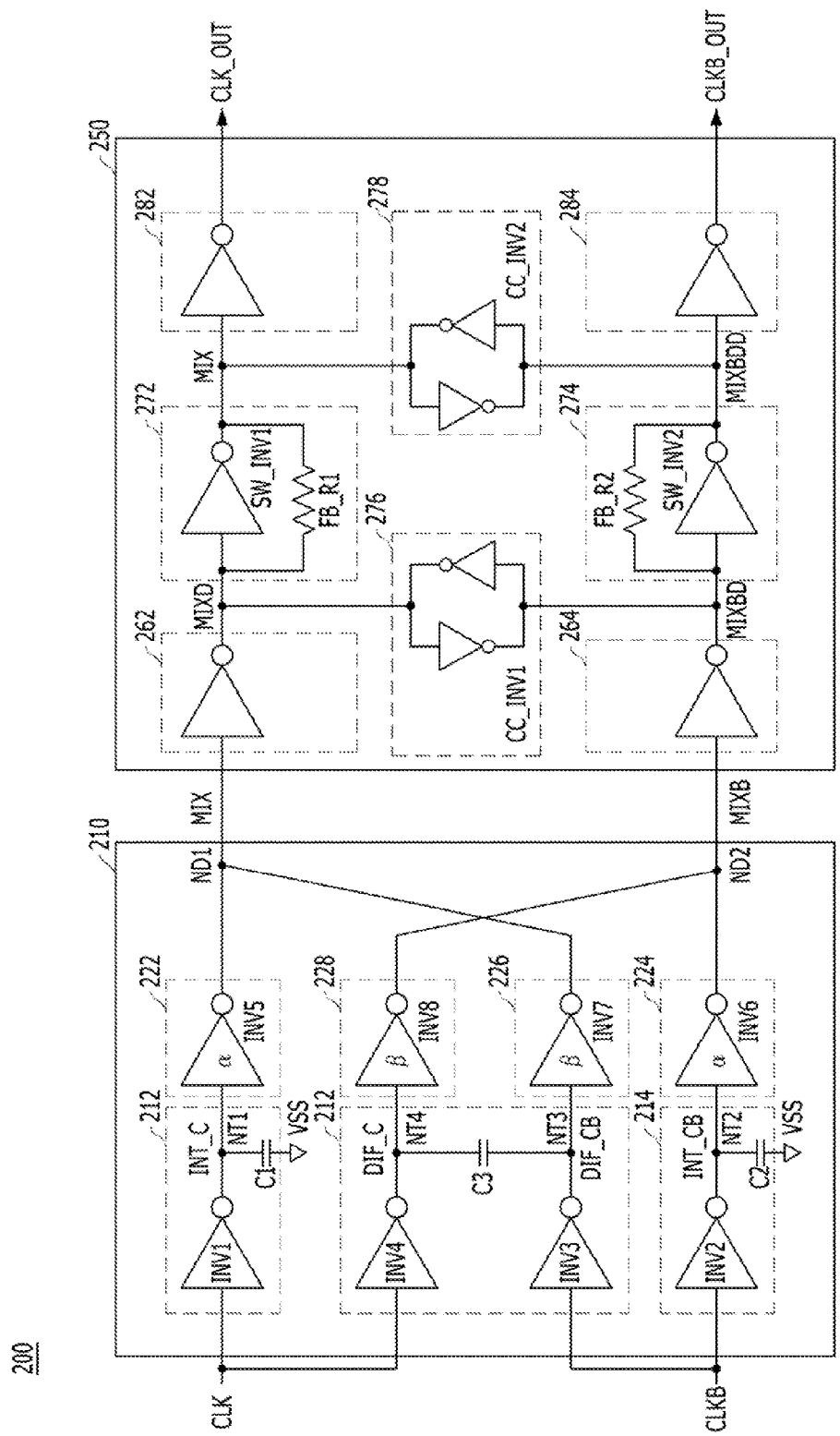
FIG. 3 is a detailed circuit diagram of the duty cycle correction circuit shown in FIG. 2, according to an embodiment of the present invention.

FIG. 3 is a detailed circuit diagram of the duty cycle correction circuit 200 shown in FIG. 2, according to an embodiment of the invention.

For convenience of description, like reference signs are used for like elements in the following description.

Referring to FIG. 3, the duty cycle correction circuit 200 may include the phase mixing section 210 and the noise removal section 250.

The phase mixing section 210 may include a first inverter INV1 for receiving the positive clock signal CLK and driving a first node NT1, a first capacitor C1 coupled between the first node NT1 and a ground voltage (VSS) terminal, a second inverter INV2 for receiving the negative clock signal CLKB and driving a second node NT2, a second capacitor C2 coupled between the second node NT2 and the ground voltage (VSS) terminal, a third inverter INV3 for receiving the negative clock signal CLKB and driving a third node NT3, a fourth inverter INV4 for receiving the positive clock signal CLK and driving a fourth node NT4, a third capacitor C3 coupled between the third node NT3 and the fourth node NT4, a fifth inverter INV5 for receiving the first integrated signal INT_C at the first node NT1 and driving the compatible node ND1, a sixth inverter INV6 for receiving the second integrated signal INT_CB at the second node NT2 and driving the incompatible node ND2, a seventh inverter INV7 for receiving the first compensation signal DIF_CB at the third node NT3, and driving the compatible node ND1, and an eighth inverter INV8 for receiving the second compensation signal DIF_C outputted through the fourth node NT4, and driving the incompatible node ND2.

For example, the first inverter INV1 and the first capacitor C1 may constitute the first integration unit 212 shown in FIG. 2. The second inverter INV2 and the second capacitor C2 may constitute the second integration unit 214 shown in f FIG. 2. In order to minimize a skew between the positive clock signal CLK and the negative clock signal CLKB, the first capacitor C1 may have substantially the same capacitance as that of the second capacitor C2. The first inverter INV1 and the first capacitor C1 may integrate the positive clock signal CLK, and output the first integrated signal INT_C to the first node NT1. The second inverter INV2 and the second capacitor C2 may integrate the negative clock signal CLKB, and output the second integrated signal INT_CB to the second node NT2.

The third inverter INV3, the fourth inverter INV4, and the third capacitor C3 may constitute the differentiation and integration unit 216 shown in FIG. 2. In this case, the third capacitor C3 is used as an integrator for storing phase information of the positive clock signal CLK and the negative clock signal CLKB, and as a differentiator for correcting a delay skew of the positive clock signal CLK and the negative clock signal CLKB when the delay skew occurs at the same time.

The fifth inverter INV5 may correspond to the first gain control unit 222 shown in FIG. 2. The sixth inverter INV6 may correspond to the second gain control unit 224 shown in FIG. 2. The seventh inverter INV7 may correspond to the third gain control unit 226 shown in FIG. 2. The eighth inverter INV8 may correspond to the fourth gain control unit 228 shown in FIG. 2. In this case, the fifth inverter INV5 and the sixth inverter INV6 may have the first gain α, and the seventh inverter INV7 and the eighth inverter INV8 may have the second gain β.

Consequently, on the compatible node ND1, the first integrated signal INT_C amplified by the first gain α and the first compensation signal DIF_CB amplified by the second gain β are mixed and outputted as the first phase-mixed signal MIX. In addition, on the incompatible node ND2, the second integrated signal INT_CB amplified by the first gain α and the second compensation signal DIF_C amplified by the second gain β are mixed and outputted as the second phase-mixed signal MIXB. In this case, since the first gain α is greater than the second gain β, the first phase-mixed signal MIX may be generated so that the positive clock signal CLK has a dominant effect on the compatible node ND1 in comparison with the negative clock signal CLKB, and the second phase-mixed signal MIXB may be generated so that the negative clock signal CLKB has a dominant effect on the incompatible node ND2 in comparison with the positive clock signal CLK.

The noise removal section 250 may adjust the cross point between the first and second phase-mixed signals MIX and MIXB at the compatible node ND1 and the incompatible node ND2, respectively, to remove the common mode noise therebetween.

More specifically, the noise removal section 250 may include the first input buffer 262, the second input buffer 264, the first swing reduction buffer 272, the second swing reduction buffer 274, the first driving strength compensation module 276, the second driving strength compensation module 278, the first output buffer 282, and the second output buffer 284.

The first input buffer 262, the second input buffer 264, the first output buffer 282, and the second output buffer 284 may be configured with inverters. However, such a configuration is only an example, and may be changed to logic gates or the like having the same function as the inverters. The first swing reduction buffer 272 may be implemented with a first swing inverter SW_INV1 coupled between the terminal for the first swing input signal MIXD and the terminal for the first swing output signal MIXDD, and a first feedback resistor FB_R1 coupled in parallel with the first swing inverter SW_INV1. The second swing reduction buffer 274 may be implemented with a second swing inverter SW_INV2 coupled between the terminal for the second swing input signal MIXBD and the terminal for the second swing output signal MIXBDD, and a second feedback resistor FB_R2 coupled in parallel with the second swing inverter SW_INV2. The first driving strength compensation module 276 may be configured with a first cross-coupled inverter pair CC_INV1 coupled between the terminal for the first swing input signal MIXD and the terminal for the second swing input signal MIXBD. The second driving strength compensation module 278 may be configured with a second cross-coupled inverter pair CC_INV2 coupled between the terminal for the first swing output signal MIXDD and the terminal for the second swing output signal MIXBDD.

Generally, since it may be practically impossible to design an inverter to have a precise PMOS to NMOS size ratio (P/N ratio), the driving strengths of a PMOS transistor and a NMOS transistor may differ depending on process, voltage, and temperature (PVT) variations. The difference between the driving strengths may in turn cause a cross-point mismatching between the differential signals. In accordance with an embodiment of the present invention, the rising times and falling times of the respective input and output differential signals, i.e., the first and second swing input signals MIXD and MIXBD and the first and second swing output signals MIXDD and MIXBDD, are controlled by compensating the difference of the driving strengths between the PMOS transistor and the NMOS transistor of the first and second swing inverters SW_INV1 and SW_INV2 through the feedback resistors FB_R1 and FB_R2 of the first and second swing reduction buffers 272 and 274 and the first and second driving strength compensation modules 276 and 278, so that the cross-point of the input and output differential signals can be matched, and a common mode noise can be removed.

Figure 4A:
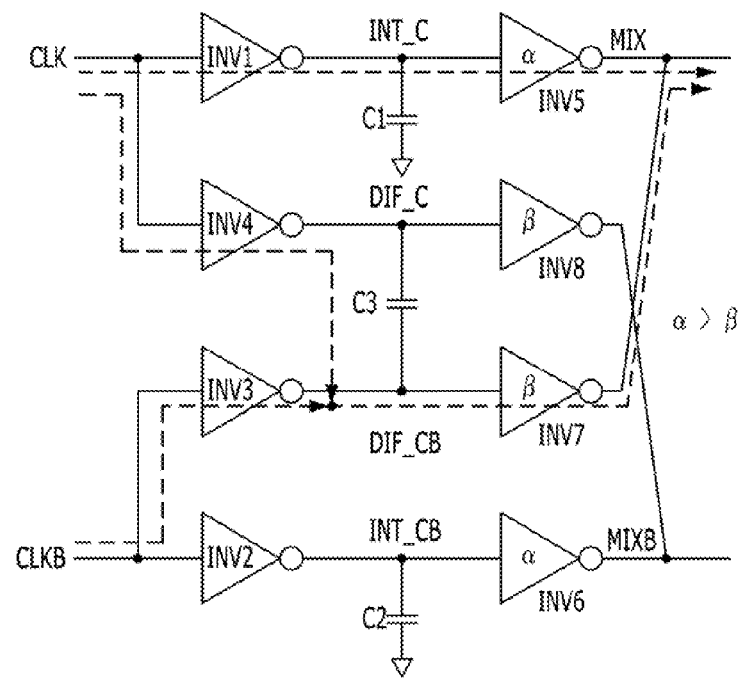
FIGS. 4A and 4B are circuit diagrams explaining an operation of a phase mixing section shown in FIG. 3, according to an embodiment of the present invention.
Figure 4B:
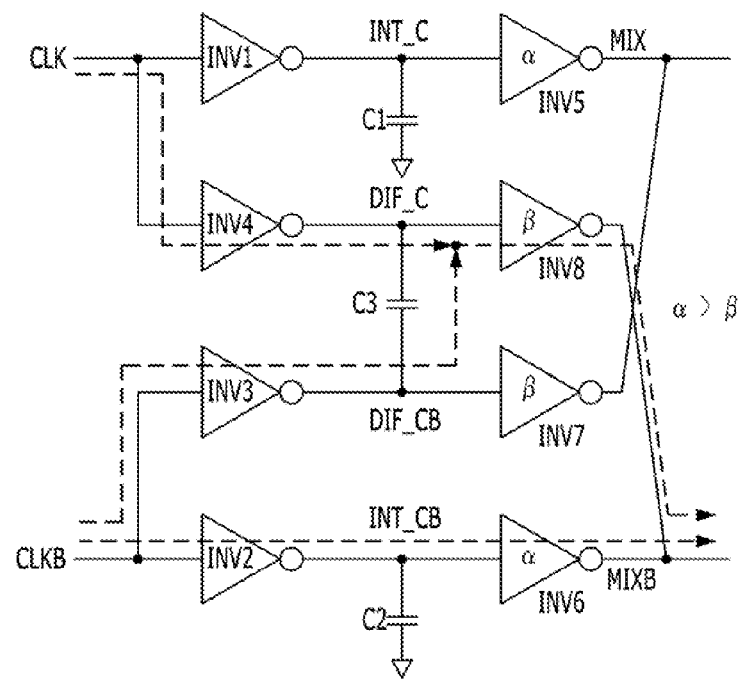

FIGS. 4A and 4B are circuit diagrams explaining an operation of the phase mixing section 210 shown in FIG. 3. FIG. 4A is a circuit diagram illustrating a process of generating the first phase-mixed signal MIX, and FIG. 4B is a circuit diagram illustrating a process of generating the second phase-mixed signal MIXB.

Referring to FIG. 4A, the first phase-mixed signal MIX may be generated by mixing the first integrated signal INT_C generated by integrating the positive clock signal CLK, with the first compensation signal DIF_CB generated by differentiating and integrating the positive clock signal CLK and the negative clock signal CLKB, respectively.

That is to say, the positive clock signal CLK may pass through an integrator configured with the first inverter INV1 and the first capacitor C1, and then may be outputted as the first integrated signal INT_C. In addition, a signal generated by passing the positive clock signal CLK through a differentiator configured with the fourth inverter INV4 and the third capacitor C3, and a signal generated by passing the negative clock signal CLKB through an integrator configured with the third inverter INV3 and the third capacitor C3 may be mixed and outputted as the first compensation signal DIF_CB. Finally, a signal obtained by amplifying the first integrated signal INT_C by the first gain α through the fifth inverter INT5, and a signal obtained by amplifying the first compensation signal DIF_CB by the second gain β through the seventh inverter INV7 may be mixed and outputted as the first phase-mixed signal MIX. In this case, since the first gain α is greater than the second gain β, the first phase-mixed signal MIX may be generated so that the positive clock signal CLK has a dominant effect in comparison with the negative clock signal CLKB.

Referring to FIG. 4B, the second phase-mixed signal MIXB may be generated by mixing the second integrated signal INT_CB generated by integrating the negative clock signal CLKB, with the second compensation signal DIF_C generated by integrating and differentiating the positive clock signal CLK and the negative clock signal CLKB, respectively.

That is to say, the negative clock signal CLKB may pass through an integrator configured with the second inverter INV2 and the second capacitor C2, and then may be outputted as the second integrated signal INT_CB. In addition, a signal generated by passing the negative dock signal CLKB through a differentiator configured with the third inverter INV3 and the third capacitor C3, and a signal generated by passing the positive clock signal CLK through an integrator configured with the fourth inverter INV4 and the third capacitor C3 may be mixed and outputted as the second compensation signal DIF_C. Finally, a signal obtained by amplifying the second integrated signal INT_CB by the first gain α through the sixth inverter INT6, and a signal obtained by amplifying the second compensation signal DIF_C by the second gain β through the eighth inverter INV8 may be mixed and outputted as the second phase-mixed signal MIXB. In this case, since the first gain α is greater than the second gain β, the second phase-mixed signal MIXB may be generated so that the negative clock signal CLKB has a dominant effect in comparison with the positive clock signal CLK.

For example, the integrator and the differentiator may be distinguished from each other depending on whether or not a corresponding signal passes through a capacitor. For example, a signal generated by passing the positive clock signal CLK which has passed through both the fourth inverter INV4 and the third capacitor C3 is a differentiated signal in FIG. 4A, and a signal generated by passing the positive clock signal CLK which has passed through only the fourth inverter INV4 is an integrated signal in FIG. 4B.

Hereinafter, the operation of the duty cycle correction circuit 200 in accordance with an embodiment of the present invention will be described with reference to FIGS. 2 to 5.

Figure 5:
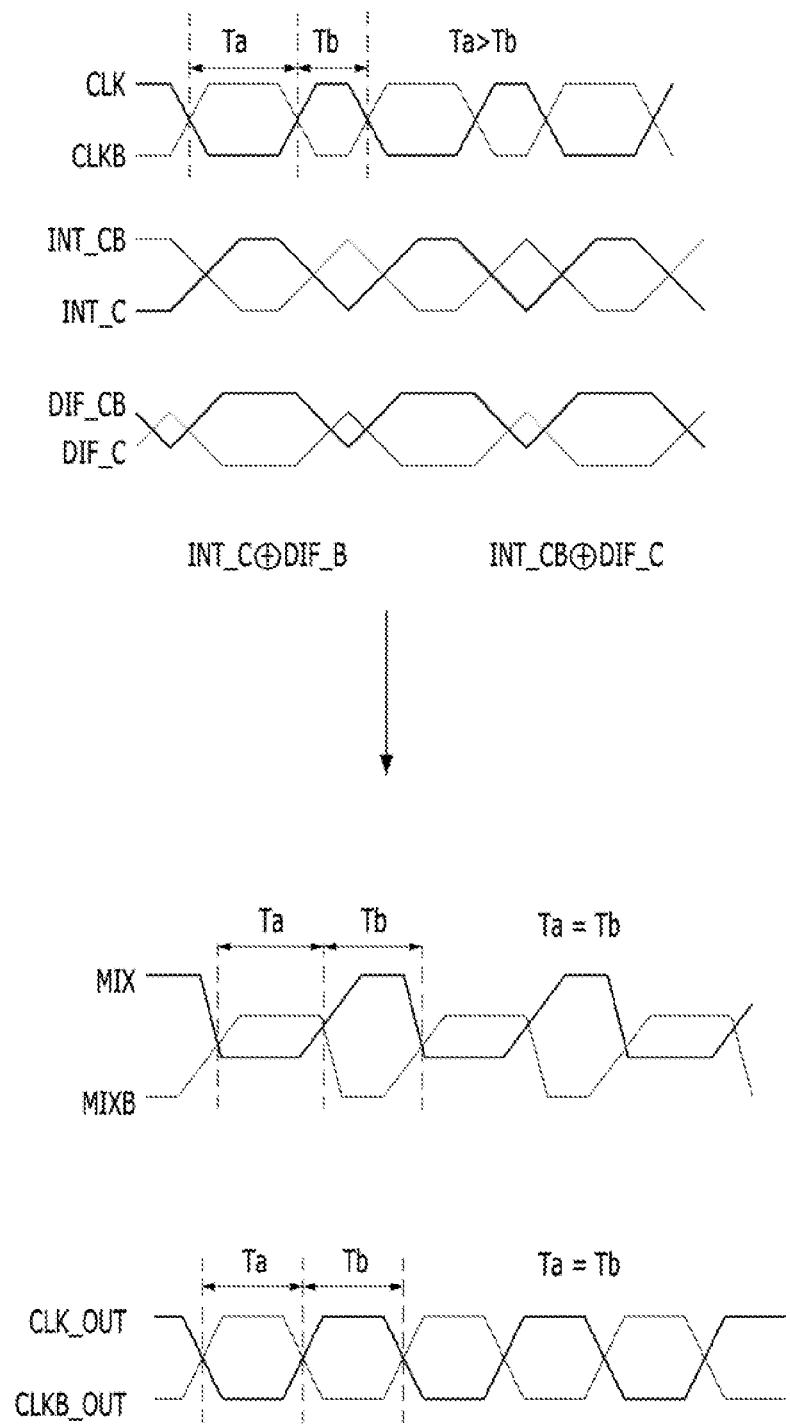
FIG. 5 is a waveform diagram explaining an operation of the duty cycle correction circuit shown in FIG. 2, according to an embodiment of the present invention.

FIG. 5 is a waveform diagram explaining an operation of the duty cycle correction circuit 200 shown in FIG. 2.

Referring to FIG. 5, the positive clock signal CLK is outputted as the first integrated signal INT_C through an integrator configured with the first inverter INV1 and the first capacitor C1, and the negative clock signal CLKB is outputted as the second integrated signal INT_CB through an integrator configured with the second inverter INV2 and the second capacitor C2. In addition, a signal generated by passing the positive clock signal CLK through a differentiator configured with the fourth inverter INV4 and the third capacitor C3 and a signal generated by passing the negative clock signal CLKB through an integrator configured with the third inverter INV3 and the third capacitor C3 are mixed and outputted as the first compensation signal DIF_CB; and a signal generated by passing the negative clock signal CLKB through a differentiator configured with the third inverter INV3 and the third capacitor C3 and a signal generated by passing the positive clock signal CLK through an Integrator configured with the fourth inverter INV4 and the third capacitor C3 are mixed and outputted as the second compensation signal DIF_C.

Therefore, finally, a signal obtained by amplifying the first integrated signal INT_C by the first gain α through the fifth inverter INV5, and the signal obtained by amplifying the first compensation signal DIF_CB by the second gain β through the seventh inverter INV7 are mixed and outputted as the first phase-mixed signal MIX; and a signal obtained by amplifying the second integrated signal INT_CB by the first gain α through the sixth inverter INV6, and a signal obtained by amplifying the second compensation signal DIF_C by the second gain β through the eighth inverter INV8 are mixed and outputted as the second phase-mixed signal MIXB.

At this time, the first phase-mixed signal MIX and the second phase-mixed signal MIXB outputted from the phase mixing section 210 have an equal ratio of a high level period Ta to a low level period Tb, while a cross point between the first phase-mixed signal MIX and the second phase-mixed signal MIXB is mismatched.

The noise removal section 250 receives the first phase-mixed signal MIX and the second phase-mixed signal MIXB, matches the mismatched cross point between the first phase-mixed signal MIX and the second phase-mixed signal MIXB by adjusting the rising time and falling time thereof, and removes the common mode noise, thereby outputting the first duty-corrected clock signal CLK_OUT and the second duty-corrected clock signal CLKB_OUT.

Thus, finally, the first duty-corrected clock signal CLK_OUT and the second duty-corrected clock signal CLKB_OUT have the same ratio of a high level period Ta to a low level period Tb, and simultaneously, the cross point therebetween is compensated, so that the duty-corrected clock signals can be outputted with a duty cycle corrected.

As described above, in accordance with an embodiment of the present invention, the duty cycle correction circuit has a structure in which phase information of a positive clock signal CLK and a negative clock signal CLKB can be mixed in a feed-forward manner, and then duty cycle correction for mismatching of a common mode occurring on the phase mixing can be achieved through a common mode compensation unit implemented with cross-coupled inverters and through a swing reduction buffer implemented with an inverter buffer using a feedback resistor FB_R. Therefore, compared with the conventional duty cycle correction circuit using a feed-back loop, the duty cycle correction circuit in accordance with an embodiment of the present invention can correct a duty cycle within a short period of time through phase mixing in real time.

In accordance with an embodiment of the present invention, since the duty cycle correction circuit may remove or minimize a locking time, the performance of a system including a semiconductor memory device in which a standby mode and an operation mode are repeated can be improved.

In accordance with an embodiment of the present invention, since the duty cycle correction circuit can correct a duty cycle through an inverter, a digital logic gate, or the like, instead of an analog amplifier, immunity against process, voltage, and temperature (PVT) variations can be relatively enhanced.

In accordance with an embodiment of the present invention, since the duty cycle correction circuit can correct a duty cycle in real time without a locking time, a period of time required for the entire operation can be reduced.

Although various embodiments have been described for illustrative purposes, it will be apparent to those skilled in the art that various changes and modifications may be made without departing from the spirit and or scope of the invention as defined in the following claims.

For example, the positions and types of the logic gates and transistors illustrated in the aforementioned embodiments may vary depending on the polarities of input signals.

What is claimed is:

1. A duty cycle correction circuit comprising:
   a phase mixing section capable of mixing a first integrated signal generated by integrating a positive clock signal, with a first compensation signal generated by differentiating and integrating the positive clock signal and a negative clock signal, respectively, to generate a first phase-mixed signal, and mixing a second integrated signal generated by integrating the negative clock signal, with a second compensation signal generated by integrating and differentiating the positive clock signal and the negative clock signal, respectively, to generate a second phase-mixed signal; and
   a noise removal section capable of receiving and removing a common mode noise between the first phase-mixed signal and the second phase-mixed signal by adjusting a cross-point therebetween, and outputting first and second duty-corrected clock signals.

2. The circuit of claim 1, wherein the phase mixing section comprises:
   a first integration unit capable of integrating the positive clock signal and generating the first integrated signal;
   a second integration unit capable of integrating the negative clock signal and generating the second integrated signal;
   a differentiation and integration unit capable of differentiating and integrating the positive clock signal and the negative clock signal, respectively, to generate the first compensation signal, and differentiating and integrating the negative clock signal and the positive clock signal, respectively, to generate the second compensation signal;

a first gain control unit capable of amplifying by a first gain and outputting the first integrated signal to an output node of the first phase-mixed signal;

a second gain control unit capable of amplifying by the first gain and outputting the second integrated signal to an output node of the second phase-mixed signal;

a third gain control unit capable of amplifying by a second gain and outputting the first compensation signal to the output node of the first phase-mixed signal, the first gain being greater than the second gain; and a fourth gain control unit capable of amplifying by the second gain and outputting the second compensation signal to the output node of the second phase-mixed signal.

3. The circuit of claim 2, wherein each of the first and second integration units comprises:

an inverter capable of receiving an assigned signal of the positive clock signal and the negative clock signal and driving an integration node; and a capacitor coupled between the integration node and a ground voltage terminal, wherein an assigned signal of the first integrated signal and the second integrated signal is outputted through the integration node.

4. The circuit of claim 2, wherein the differentiation and integration unit comprises:

a first inverter capable of receiving the negative clock signal and driving a first node;

a second inverter capable of receiving the positive clock signal and driving a second node; and a capacitor coupled between the first node and the second node, wherein the first compensation signal is outputted through the first node, and the second compensation signal is outputted through the second node.

5. The circuit of claim 2, wherein the first and fourth gain control units comprises an inverter having the first gain, and the second and third gain control units comprises an inverter having the second gain.

6. The circuit of claim 1, wherein the noise removal section comprises:

an input buffer unit capable of buffering the first phase-mixed signal and the second phase-mixed signal and outputting first and second swing input signals;

a common mode compensation unit capable of receiving the first and second swing input signals and outputting first and second swing output signals, wherein a cross point between the first and second swing input signals and a cross point between the first and second swing output signals are adjusted to remove a common mode noise; and an output buffer unit capable of buffering the first and second swing output signals, and outputting the first and second duty-corrected clock signals.

7. The circuit of claim 6, wherein the common mode compensation unit comprises:

a first swing reduction buffer capable of buffering the first swing input signal and outputting the first swing output signal;

a second swing reduction buffer capable of buffering the second swing input signal and outputting the second swing output signal;

a first driving strength compensation module capable of being coupled between a first swing input signal terminal and a second swing input signal terminal, and compensating a driving strength of the first and second swing input signals; and a second driving strength compensation module capable of being coupled between a first swing output signal terminal and a second swing output signal terminal, and compensating a driving strength of the first and second swing output signals.

8. The circuit of claim 7, wherein each of the first and second swing reduction buffers comprises:

an inverter capable of receiving an assigned signal of the first and second swing input signals, and outputting an assigned signal of the first and second swing output signals; and a feedback resistor coupled in parallel with the inverter.

9. The circuit of claim 7, wherein the first driving strength compensation module comprises a cross-coupled inverter pair capable of being coupled between the first swing input signal terminal and the second swing input signal terminal and compensating the driving strength of the first and second swing input signals; and the second driving strength compensation module comprises a cross-coupled inverter pair capable of being coupled between the first swing output signal terminal and the second swing output signal terminal and compensating the driving strength of the first and second swing output signals.

10. A duty cycle correction circuit comprising:

a first inverter capable of receiving a positive clock signal and driving a first node;

a first capacitor coupled between the first node and a ground voltage terminal;

a second inverter capable of receiving a negative clock signal and driving a second node;

a second capacitor coupled between the second node and the ground voltage terminal;

a third inverter capable of receiving the negative clock signal and driving a third node;

a fourth inverter capable of receiving the positive clock signal and driving a fourth node;

a third capacitor coupled between the third node and the fourth node;

a fifth inverter capable of receiving a first integrated signal outputted through the first node, and driving a compatible node;

a sixth inverter capable of receiving a second integrated signal outputted through the second node, and driving an incompatible node;

a seventh inverter capable of receiving a first compensation signal outputted through the third node, and driving the compatible node; and an eighth inverter capable of receiving a second compensation signal outputted through the fourth node, and driving the incompatible node.

11. The circuit of claim 10, wherein the gain of the fifth and sixth inverters is greater than the gain of the seventh and eighth inverters.

12. The circuit of claim 10, wherein the first capacitor has a capacitance substantially equal to that of the second capacitor.

13. The circuit of claim 10, further comprising:

a noise removal section capable of adjusting a cross point between first and second phase-mixed signals outputted through the compatible node and the incompatible node, respectively, to remove a common mode noise.

14. The circuit of claim 13, wherein the noise removal section comprises:
- a first input buffer capable of buffering the first phase-mixed signal and outputting a first swing input signal;
- a second input buffer capable of buffering the second phase-mixed signal and outputting a second swing input signal;
- a common mode compensation unit capable of receiving the first and second swing input signals and outputting first and second swing output signals, wherein a cross point between the first and second swing input signals and a cross point between the first and second swing output signals are adjusted to remove the common mode noise;
- a first output buffer capable of buffering the first swing output signal and outputting a first duty-corrected clock signal; and
- a second output buffer capable of buffering the second swing output signal and outputting a second duty-corrected clock signal.

15. The circuit of claim 14, wherein each of the first and second input buffers and the first and second output buffers comprises an inverter.

16. The circuit of claim 14, wherein the common mode compensation unit comprises:
- a first swing reduction buffer capable of buffering the first swing input signal and outputting the first swing output signal;
- a second swing reduction buffer capable of buffering the second swing input signal and outputting the second swing output signal;
- a first driving strength compensation module capable of being coupled between a first swing input signal terminal and a second swing input signal terminal, and compensating a driving strength of the first and second swing input signals; and
- a second driving strength compensation module capable of being coupled between a first swing output signal terminal and a second swing output signal terminal, and compensating a driving strength of the first and second swing output signals.

17. The circuit of claim 16, wherein each of the first and second swing reduction buffers comprises:
- an inverter capable of receiving an assigned signal of the first and second swing input signals, and outputting an assigned signal of the first and second swing output signals; and
- a feedback resistor coupled in parallel with the inverter.

18. The circuit of claim 16, wherein the first driving strength compensation module comprises a cross-coupled inverter pair coupled between the first swing input signal terminal and the second swing input signal terminal; and
the second driving strength compensation module comprises a cross-coupled inverter pair coupled between the first swing output signal terminal and the second swing output signal terminal.

19. A duty cycle correction method comprising:
mixing a first integrated signal generated by integrating a positive clock signal, with a first compensation signal generated by differentiating and integrating the positive clock signal and a negative clock signal, respectively, to generate a first phase-mixed signal;
mixing a second integrated signal generated by integrating the negative clock signal, with a second compensation signal generated by integrating and differentiating the positive clock signal and the negative clock signal, respectively, to generate a second phase-mixed signal; and
removing a common mode noise by adjusting a cross point between the first phase-mixed signal and the second phase-mixed signal.

20. The method of claim 19, wherein the generating of the first phase-mixed signal comprises:
integrating the positive clock signal and generating the first integrated signal;
differentiating and integrating the positive clock signal and the negative clock signal, respectively, and generating the first compensation signal; and
amplifying the first integrated signal by a first gain, amplifying the first compensation signal by a second, and mixing the amplified signals, the first gain being greater than the second gain.

21. The method of claim 19, wherein the generating of the second phase-mixed signal comprises:
integrating the negative clock signal and generating the second integrated signal;
differentiating and integrating the negative clock signal and the positive clock signal, respectively, and generating the second compensation signal; and
amplifying the second integrated signal by the first gain, amplifying the second compensation signal by the second gain, and mixing the amplified signals, the first gain being greater than the second gain.

22. The method of claim 19, wherein the removing of the common mode noise comprises:
buffering the first phase-mixed signal and the second phase-mixed signal, and outputting first and second swing input signals;
receiving the first and second swing input signals and outputting first and second swing output signals, wherein a cross point between the first and second swing input signals and a cross point between the first and second swing output signals are adjusted to remove the common mode noise; and
buffering the first and second swing output signals and outputting first and second duty-corrected clock signals.

23. The duty cycle correction circuit of claim 1, wherein the phase mixing section does not receive the first and second duty-corrected clock signals outputted from the noise removal section.

24. The method of claim 19, further comprising:
outputting first and second duty-corrected clock signals in a feed-forward manner, after removing the common mode noise.

* * * * *